US012567735B2

(12) United States Patent
Chen et al.

(10) Patent No.: US 12,567,735 B2
(45) Date of Patent: Mar. 3, 2026

(54) COMPOSITE CIRCUIT PROTECTION DEVICE

(71) Applicant: FUZETEC TECHNOLOGY CO., LTD., New Taipei City (TW)

(72) Inventors: Jack Jih-Sang Chen, New Taipei City (TW); Chang-Hung Jiang, New Taipei City (TW)

(73) Assignee: FUZETEC TECHNOLOGY CO., LTD., New Taipei City (TW)

( * ) Notice: Subject to any disclaimer, the term of this patent is extended or adjusted under 35 U.S.C. 154(b) by 176 days.

(21) Appl. No.: 18/412,121

(22) Filed: Jan. 12, 2024

(65) Prior Publication Data

US 2025/0233409 A1     Jul. 17, 2025

(51) Int. Cl.
| | |
|---|---|
| *H02H 9/00* | (2006.01) |
| *H01C 1/14* | (2006.01) |
| *H01C 7/02* | (2006.01) |
| *H01L 23/62* | (2006.01) |

(52) U.S. Cl.
CPC ................. *H02H 9/00* (2013.01); *H01C 1/14* (2013.01); *H01C 7/028* (2013.01); *H01L 23/62* (2013.01)

(58) Field of Classification Search
CPC ........... H01C 1/14; H01C 7/028; H01L 23/62; H02H 9/00
USPC ......................................................... 361/56
See application file for complete search history.

(56) References Cited

U.S. PATENT DOCUMENTS

| | | | | |
|---|---|---|---|---|
| 3,708,720 A | * | 1/1973 | Whitney | ................ H02H 5/042 |
| | | | | 318/473 |
| 8,508,328 B1 | * | 8/2013 | Chen | ........................ H01C 7/02 |
| | | | | 338/21 |
| 2008/0265326 A1 | * | 10/2008 | Hebert | .................... H01L 24/73 |
| | | | | 257/355 |

FOREIGN PATENT DOCUMENTS

JP          2000152516 A   *   5/2000

OTHER PUBLICATIONS

Machine translation of Umezawa Japanese Patent Document JP 2000-152516 A May 30, 2000 (Year: 2000).*

* cited by examiner

*Primary Examiner* — Kevin J Comber
(74) *Attorney, Agent, or Firm* — HSML P.C.

(57) ABSTRACT

A composite circuit protection device includes a transistor, a positive temperature coefficient (PTC) component, a first lead pin, a second lead pin and a third lead pin. The transistor includes a drain electrode, a gate electrode and a source electrode. The PTC component includes a first electrode, a second electrode, and a PTC matrix disposed between the first electrode and the second electrode. The second electrode is in contact with the gate electrode of the transistor. The first lead pin is bonded to the drain electrode of the transistor. The second lead pin is bonded to one of the first electrode and the second electrode of the PTC component. The third lead pin is bonded to the source electrode of the transistor.

15 Claims, 13 Drawing Sheets

COMPOSITE CIRCUIT PROTECTION DEVICE

FIELD

The disclosure relates to a composite circuit protection device, and more particularly to a composite circuit protection device including a positive temperature coefficient (PTC) component and a transistor.

BACKGROUND

U.S. Pat. No. 8,508,328 discloses an insertable polymer positive temperature coefficient (PPTC) over-current protection device that includes a PTC polymer matrix formed with a hole, two electrodes formed on two opposite surfaces of the PTC polymer matrix, and two lead pins respectively bonded to the electrodes. The PTC polymer matrix is made of a polymer material including a conductive filler.

There is a need to enhance electrical properties (e.g., operating current and high-voltage surge endurability) of the PPTC over-current protection device, so as to protect the PPTC over-current protection device from being damaged by an over-voltage. Although the operating current of the PPTC over-current protection device can be enhanced by decreasing a thickness or an area of the PTC polymer matrix, the high-voltage surge endurability of the PPTC over-current protection device may be decreased. In addition, the high-voltage endurability of the PPTC over-current protection device can be enhanced by increasing the thickness or the area of the PTC polymer matrix, but a size of the PPTC over-current protection device may be undesirably increased and the high-voltage surge endurability of the PPTC over-current protection device may not be enhanced.

A transistor has a function of voltage-controlled switching. When an over-voltage surge or an over-current surge occurs, the transistor may be burned out or may be malfunctioned if a time period of the surge exceeds a certain period of time (may be referred to as a burned-out time), which may damage the function of a circuit module related to the transistor.

SUMMARY

Therefore, an object of the disclosure is to provide a composite circuit protection device that can alleviate at least one of the drawbacks of the prior art.

According to the disclosure, the composite circuit protection device includes a transistor, a positive temperature coefficient (PTC) component, a first lead pin, a second lead pin and a third lead pin. The transistor includes a drain electrode, a gate electrode and a source electrode. The PTC component includes a first electrode, a second electrode, and a PTC matrix disposed between the first electrode and the second electrode. The second electrode is in contact with the gate electrode of the transistor. The first lead pin is bonded to the drain electrode of the transistor. The second lead pin is bonded to one of the first electrode and the second electrode of the PTC component. The third lead pin is bonded to the source electrode of the transistor.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
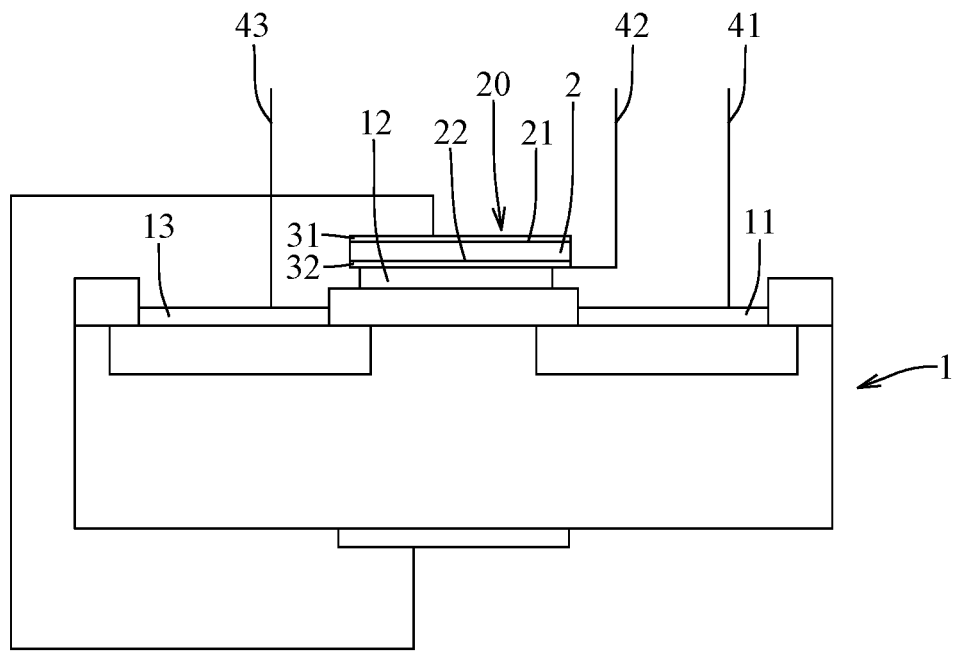
FIG. 1 is a structural diagram illustrating a first embodiment of a composite circuit protection device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
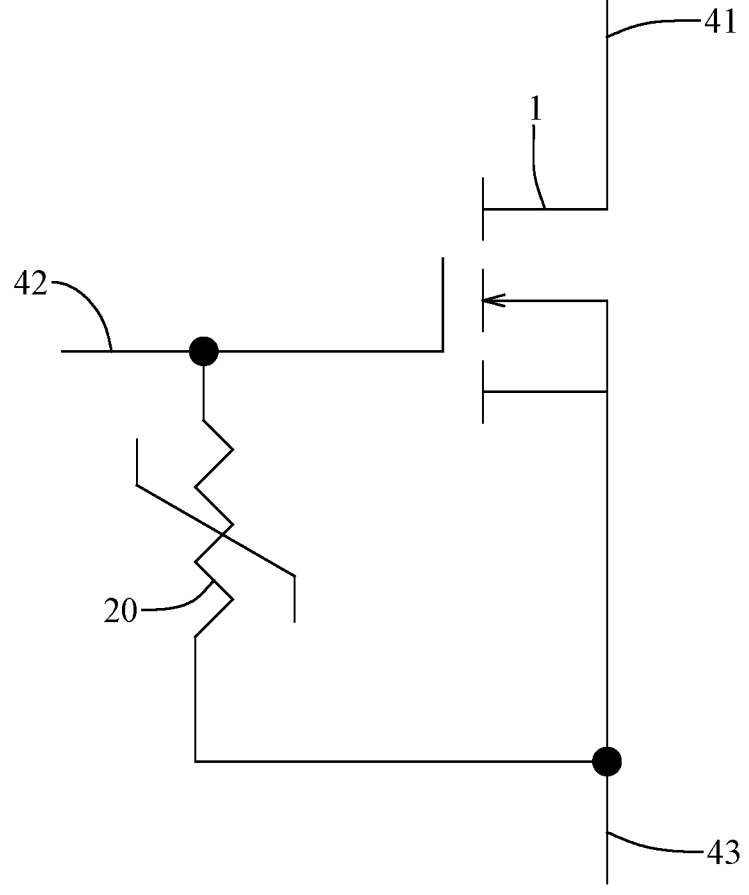
FIG. 2 is a circuit diagram illustrating the first embodiment.
Figure 3:
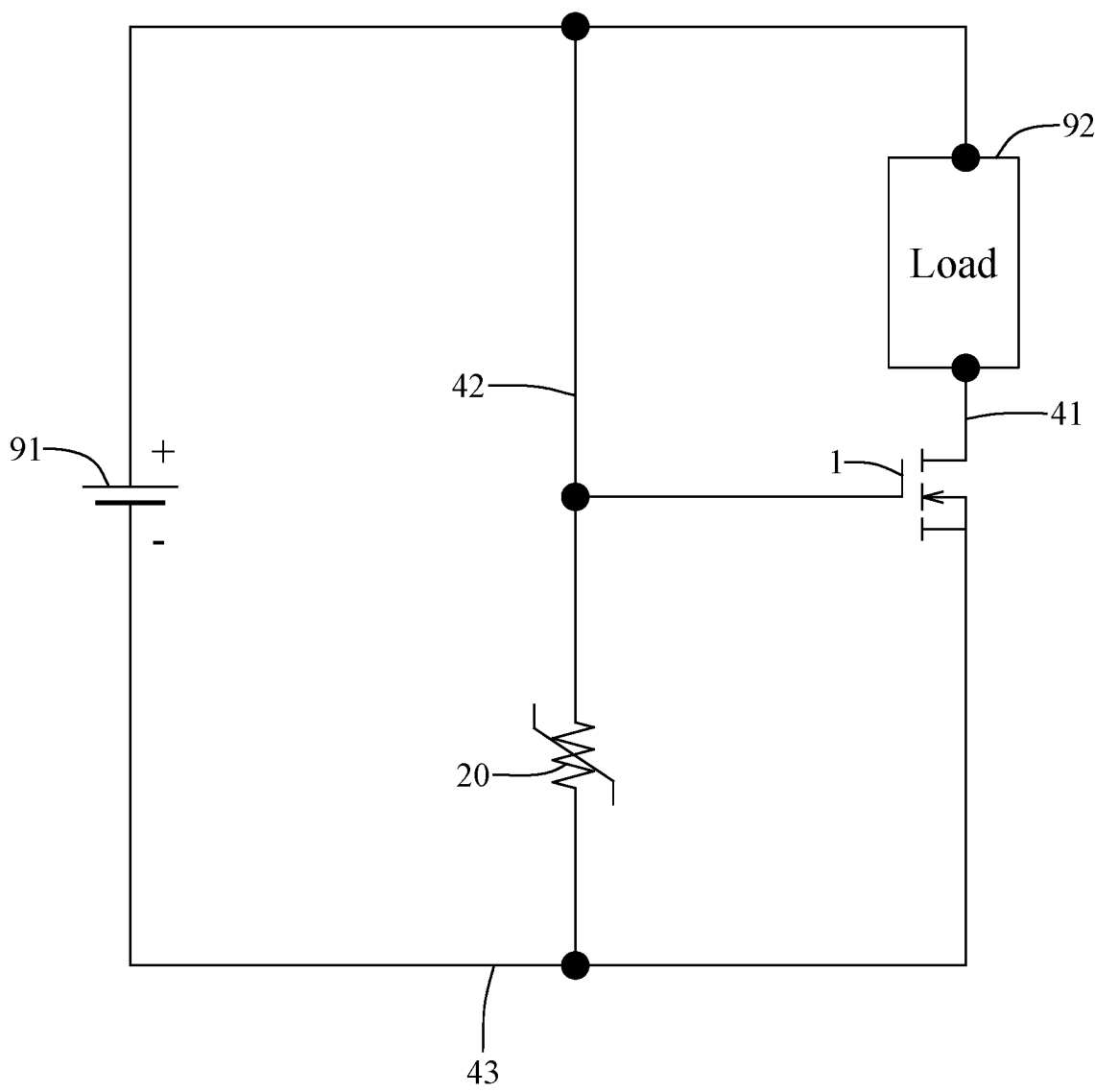
FIG. 3 is a circuit block diagram illustrating an application of the first embodiment.

Referring to FIGS. 1 to 3, a first embodiment of a composite circuit protection device according to the present disclosure includes a transistor 1, a positive temperature coefficient (PTC) component 20, a first lead pin 41, a second lead pin 42 and a third lead pin 43.

The transistor 1 (e.g., an N-type metal oxide semiconductor field effect transistor (MOSFET)) includes a drain electrode 11, a gate electrode 12 and a source electrode 13.

The PTC component 20 includes a PTC matrix 2, a first electrode 31 and a second electrode 32. The PTC matrix 2 is disposed between the first electrode 31 and the second electrode 32, and has two opposite surfaces 21, 22 that are opposite to each other in a normal direction of the PTC component 20 and that are respectively in contact with the first electrode 31 and the second electrode 32. The second electrode 32 is in contact with the gate electrode 12 of the transistor 1. The first electrode 31 is electrically connected to the source electrode 13 of the transistor 1.

The first lead pin 41 and the third lead pin 43 are respectively bonded to the drain electrode 11 and the source electrode 13 of the transistor 1. The second lead pin 42 is bonded to the second electrode 32 of the PTC component 20.

The PTC component 20 has a rated voltage that ranges between 250% and 350% of a maximum gate-source voltage of the transistor 1. In certain embodiments, the rated voltage of the PTC component 20 is 300% of the maximum gate-source voltage of the transistor 1.

The PTC matrix 2 is made of a PTC composition that includes a non-grafted olefin-based polymer and a conductive filler dispersed in the polymer, and that optionally further includes an unsaturated carboxylic acid grafted olefin-based polymer. In certain embodiments, the non-grafted olefin-based polymer is non-grafted high density polyethylene (HDPE), and the unsaturated carboxylic acid grafted olefin-based polymer is carboxylic acid anhydride grafted HDPE. In certain embodiments, the conductive filler includes carbon black, metal powder, conductive ceramic powder, or combinations thereof.

As shown in FIG. 3, in application, the composite circuit protection device of this embodiment can be used with a power source 91 and a load 92. The second lead pin 42 is electrically connected to a positive terminal of the power source 91 and a first terminal of the load 92. The first lead pin 41 is electrically connected to a second terminal of the load 92. The third lead pin 43 is electrically connected to a negative terminal of the power source 91.

Figure 4:
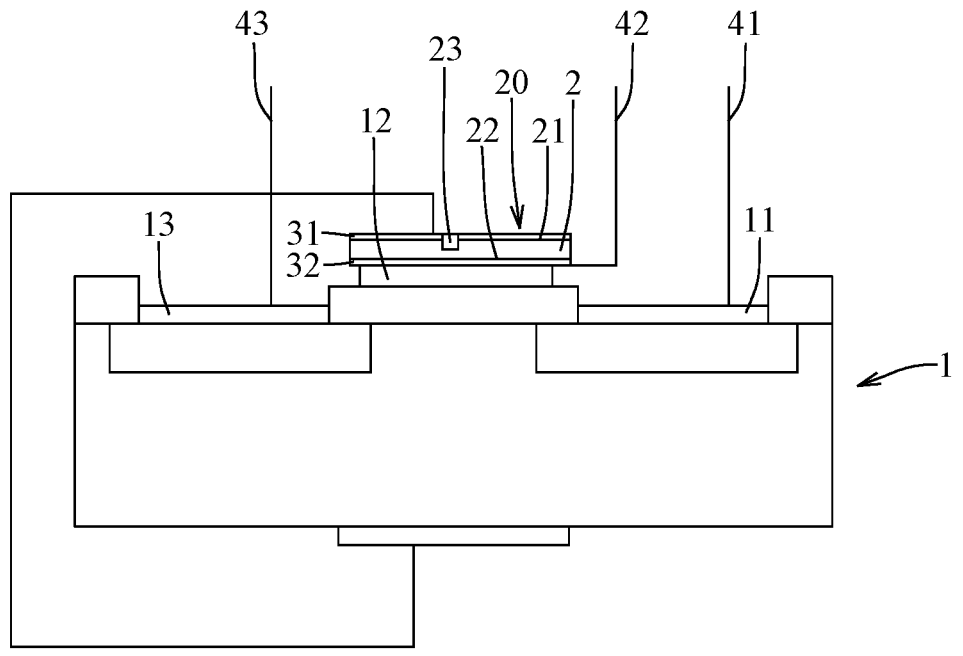
FIG. 4 is a structural diagram illustrating a second embodiment of the composite circuit protection device according to the disclosure.

Referring to FIG. 4, a second embodiment of the composite circuit protection device according to the present disclosure is generally similar to the first embodiment, except that, in the second embodiment, the PTC matrix 2 is further formed with at least one hole 23. In this embodiment, the at least one hole 23 extends through the surface 21 of the PTC matrix 2 and the first electrode 31 in the normal direction, and is spaced apart from and surrounded by a peripheral edge of the PTC matrix 2. In addition, the at least one hole 23 has an effective volume to accommodate thermal expansion of the PTC matrix 2 at an increased temperature, so as to avoid undesired structural deformation of the PTC matrix 2. The structural deformation of the PTC matrix 2 may lead to an adverse effect on electrical properties thereof, and may reduce reliability thereof.

Figure 5:
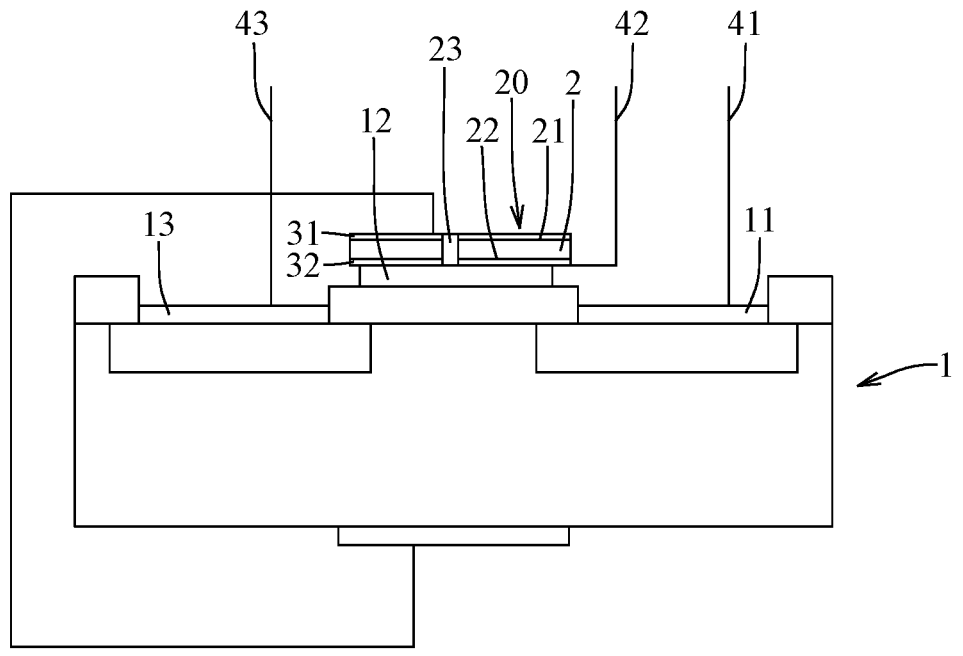
FIG. 5 is a structural diagram illustrating a variation of the second embodiment.

Referring to FIG. 5, in a variation of the second embodiment, the at least one hole 23 is a through hole that extends through the two opposite surfaces 21, 22 of the PTC matrix 2 and the first and second electrodes 31, 32. The at least one hole 23 extends along a line (not shown) that passes through a geometrical center of the PTC matrix 2 and that is transverse to the surfaces 21, 22 of the PTC matrix 2. The at least one hole 23 is defined by a hole-defining surface. In this embodiment, the hole-defining surface has a cross section that has a circular shape on the surface 21 of the PTC matrix 2. In other embodiments, the cross section of the hole-defining surface may have a square shape, an oval shape, a triangular shape, or a crisscross shape.

Figure 6:
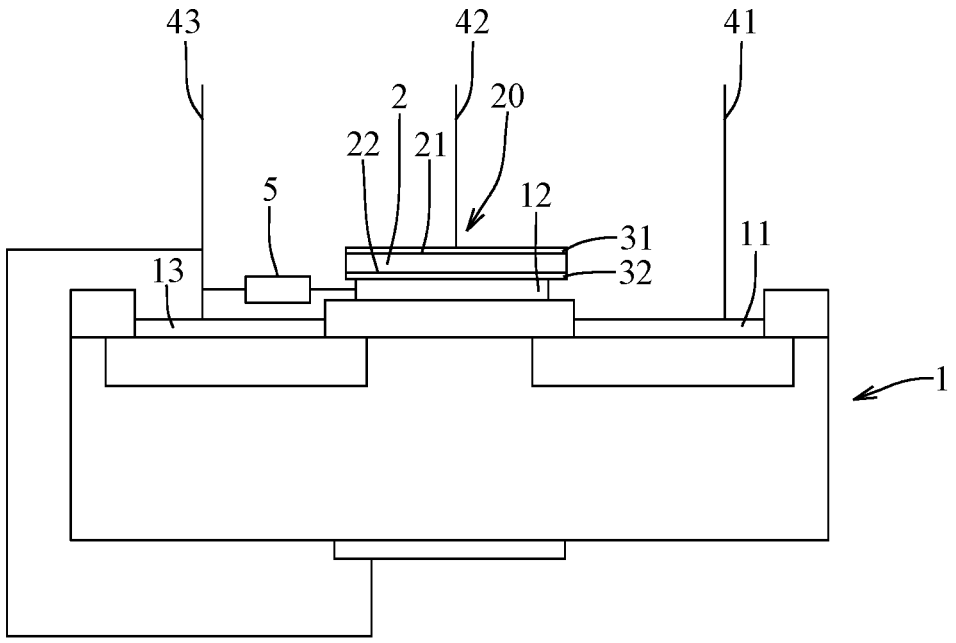
FIG. 6 is a structural diagram illustrating a third embodiment of the composite circuit protection device according to the disclosure.
Figure 7:
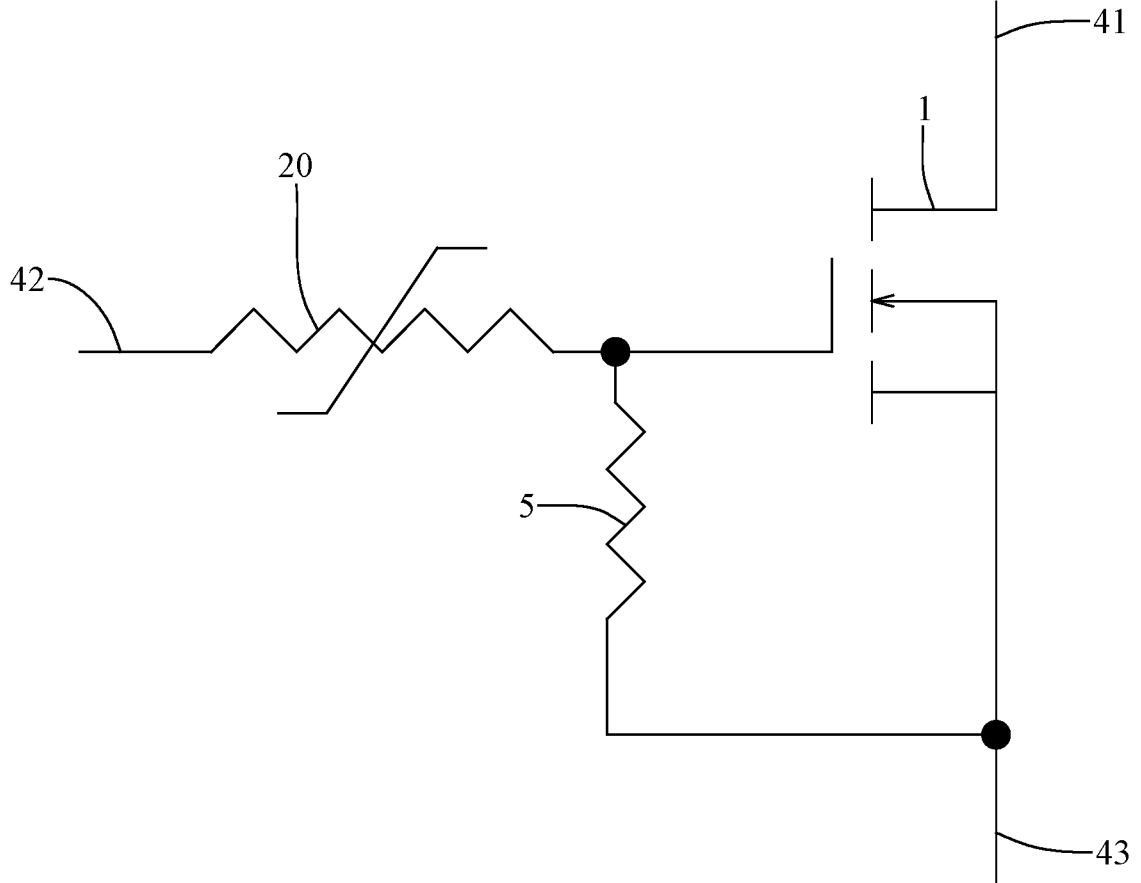
FIG. 7 is a circuit diagram illustrating the third embodiment.
Figure 8:
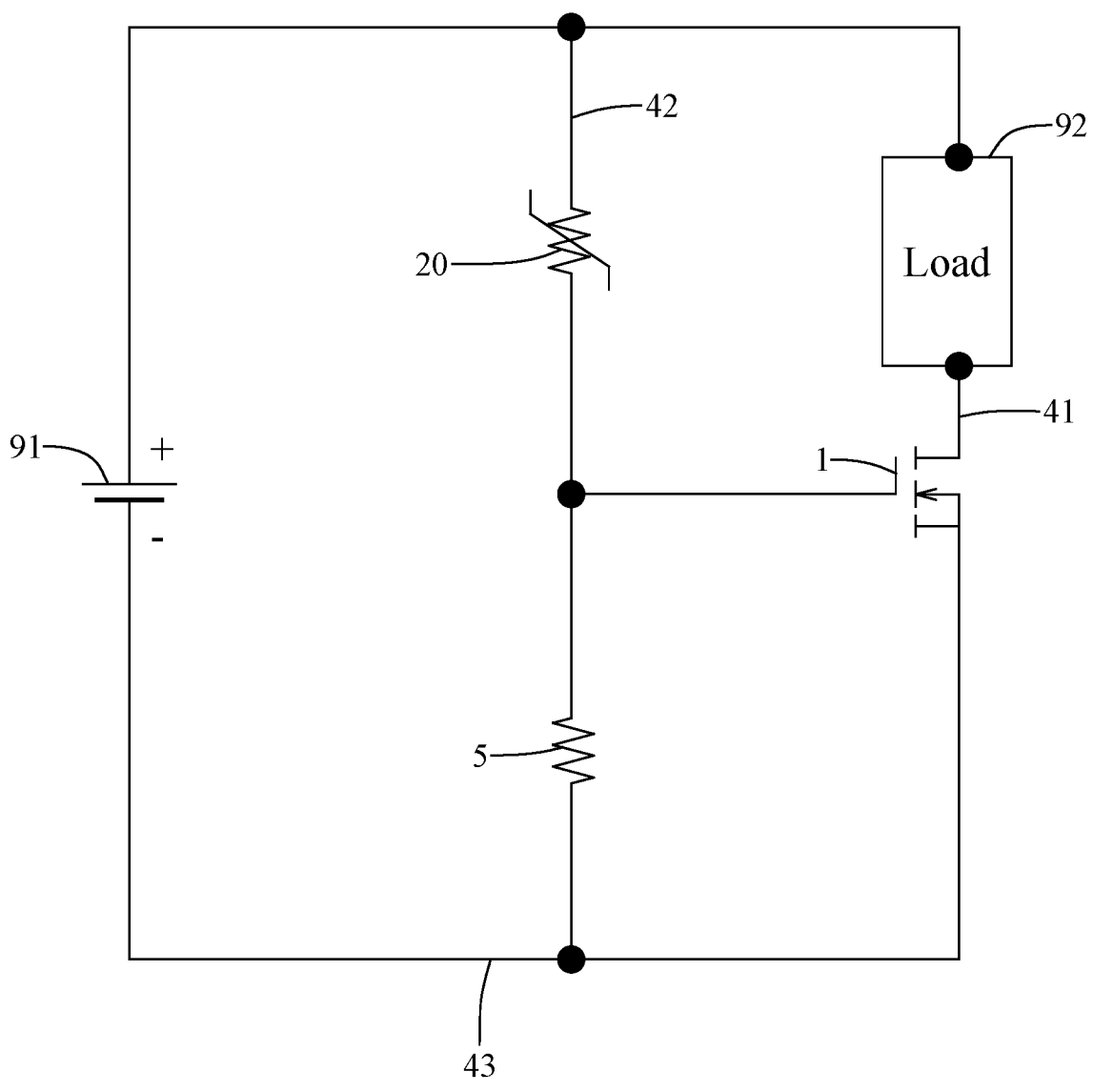
FIG. 8 is a circuit block diagram illustrating an application of the third embodiment.

Referring to FIGS. 6 to 8, a third embodiment of the composite circuit protection device according to the present disclosure is generally similar to the first embodiment, except that, in the third embodiment, the composite circuit protection device further includes a resistive element 5 that is electrically connected between the gate electrode 12 and the source electrode 13 of the transistor 1, the first electrode 31 of the PTC component 20 is not electrically connected to the source electrode 13 of the transistor 1, and the second lead pin 42 is bonded to the first electrode 31 of the PTC component 20 instead of the second electrode 32 of the PTC component 20. In this embodiment, the resistive element 5 is an N-type resistor.

As shown in FIG. 8, in application, the composite circuit protection device of this embodiment can be used with a power source 91 and a load 92. The second lead pin 42 is electrically connected to a positive terminal of the power source 91 and a first terminal of the load 92. The first lead pin 41 is electrically connected to a second terminal of the load 92. The third lead pin 43 is electrically connected to a negative terminal of the power source 91. In certain embodiments, a ratio of a resistance of the load 92 to a sum of a resistance of the PTC component 20, a resistance of the resistive element 5 and the resistance of the load 92 falls within a range of from about 0.99% to about 50%. In a first example, the resistance of the PTC component 20 is 10Ω, the resistance of the resistive element 5 is 590Ω, the resistance of the load 92 is 6Ω, and the ratio is 0.99%. In a second example, the resistance of the PTC component 20 is 1Ω, the resistance of the resistive element 5 is 59Ω, the resistance of the load 92 is 6Ω, and the ratio is 9.09%. In a third example, the resistance of the PTC component 20 is 2Ω, the resistance of the resistive element 5 is 4Ω, the resistance of the load 92 is 6Ω, and the ratio is 50%.

Figure 9:
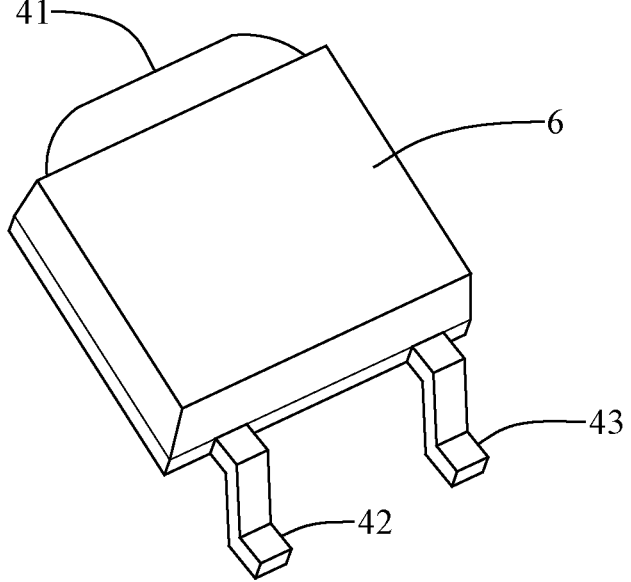
FIG. 9 is a structural diagram illustrating a fourth embodiment of the composite circuit protection device according to the disclosure.

Referring to FIG. 9, a fourth embodiment of the composite circuit protection device according to the present disclosure is generally similar to the first embodiment, except that, in the fourth embodiment, the composite circuit protection device further includes an encapsulant 6 that encloses the transistor 1 (see FIG. 1), the PTC component 20 (see FIG. 1), and a portion of each of the first, second and third lead pins 41, 42, 43. A remaining portion of each of the first, second and third lead pins 41, 42, 43 is exposed from the encapsulant 6. In certain embodiments, the encapsulant 6 is made of epoxy resin.

The disclosure will be further described by way of the following examples and comparative examples. However, it should be noted that the following examples and comparative examples are solely intended for the purpose of illustration and should not be construed as limiting the disclosure in practice.

EXAMPLES

Example 1 (E1)

12.5 grams of HDPE (purchased from Formosa Plastics Corp., catalog no.: HDPE9002), 12.5 grams of maleic anhydride grafted HDPE (purchased from DuPont, catalog no.: MB100D), and 25 grams of carbon black powder (purchased from Columbian Chemicals Co., catalog no.: Raven 430UB) were compounded in a Brabender mixer. A compounding temperature was 200° C., a stirring rate was 30 rpm, and a compounding time was 10 minutes. The resultant compounded mixture was hot pressed in a mold under 200° C. and 80 kg/cm² for 4 minutes, so as to form a PTC matrix having a thickness of 0.6 mm. Two copper foil sheets were respectively attached to two opposite surfaces of the PTC matrix and were hot pressed under 200° C. and 80 kg/cm² for 4 minutes, so as to form a PTC laminate having a sandwiched structure. The PTC laminate was cut into a plurality of PTC component chips with a chip size of 1.0 mm×1.0 mm. Each of the PTC component chips was irradiated with a Cobalt-60 gamma ray for a total irradiation dose of 150 kGy. Each of the PTC component chips has a resistance of 10Ω. A plurality of MOSFET chips (purchased from FETek Technology Corp., catalog no.: FKD0032) were respectively soldered to the PTC component chips in a manner where a gate electrode of each of the MOSFET chips was soldered to one of the two copper foil sheets of a corresponding one of the PTC component chips, and a source electrode of each of the MOSFET chips was electrically connected to the other one of the two copper foil sheets of the corresponding one of the PTC component chips, so as to form a plurality of composite devices. Afterwards, each of the composite devices was soldered with three lead pins in a manner where the three lead pins were respectively soldered to a drain electrode of the MOSFET chip, the copper foil sheet of the PTC component chip in contact with the gate electrode of the MOSFET chip, and the source electrode of the MOSFET chip, so as to form a composite circuit protection device of E1 as depicted in FIG. 1.

The PTC component chip was subjected to determination of a hold current (i.e., a maximum current value that can be applied in normal operation), a trip current (i.e., a minimum current value that is necessary for the PTC component chip to achieve a high-resistance state), a rated voltage (i.e., a voltage at which the PTC component chip is designed to work with), and a maximum withstand voltage (i.e., a maximum voltage limit that does not cause the PTC component chip to be malfunctioned or damaged) according to the Underwriters Laboratories UL 1434 Standard for Safety for Thermistor-Type Devices. Characteristic results of the PTC component chip are shown in Table 1. In addition, the MOSFET chip was subjected to determination of a maximum gate-source voltage (VGS) and a maximum continuous drain current (ID). Characteristic results of the MOSFET chip are shown in Table 2

TABLE 1

| | Hold current | Trip current | Rated voltage | Maximum withstand voltage |
|---|---|---|---|---|
| PTC component chip | 0.01 A | 0.03 A | 60 V | 60 V |

TABLE 2

| | Maximum gate-source voltage ($V_{GS}$) | Maximum continuous drain current ($I_D$)$^a$ |
|---|---|---|
| MOSFET chip | 20 V | 30 A |

$^a$determined under 25° C.

Example 2 (E2)

The procedures and conditions in preparing a composite circuit protection device of E2 as depicted in FIG. 5 was similar to those of E1, except that the PTC component chip is formed with a through hole. To be specific, after irradiated with the Cobalt-60 gamma ray and before soldered with the MOSFET chip, a center portion of the PTC component chip was punched to form the through hole. The through hole is defined by a hole-defining surface with a circular cross section that has a diameter (d) of 0.15 mm and an area ($\pi d^2/4$) of 0.0177 mm$^2$.

Examples 3 and 4 (E3 and E4)

The procedures and conditions in preparing composite circuit protection devices of E3 (as depicted in FIG. 6) and E4 were respectively similar to those of E1 (as depicted in FIG. 1) and E2 (as depicted in FIG. 5), except that each of the composite circuit protection devices of E3 and E4 further included an N-type resistor (avoiding an over-current) that was electrically connected between the gate electrode and the source electrode of the MOSFET chip and that has a resistance of 590Ω, the copper foil sheet of the PTC component chip that was not in contact with the gate electrode of the MOSFET chip was not electrically connected to the source electrode of the MOSFET chip, and one of the lead pins was soldered to the copper foil sheet of the PTC component chip that was not in contact with the gate electrode of the MOSFET chip instead of to the copper foil sheet of the PTC component chip that was in contact with the gate electrode of the MOSFET chip.

Examples 5 and 6 (E5 and E6)

Each of composite circuit protection devices of E5 and E6 was similar to that of E3 (as depicted in FIG. 6), except that, with respect to the composite circuit protection device of E5, a resistance of the PTC component chip is 1Ω and a resistance of the N-type resistor is 59Ω, and with respect to the composite circuit protection device of E6, a resistance of the PTC component chip is 2Ω and a resistance of the N-type resistor is 4Ω.

Comparative Examples 1 to 4 (CE1 to CE4)

Figure 10:
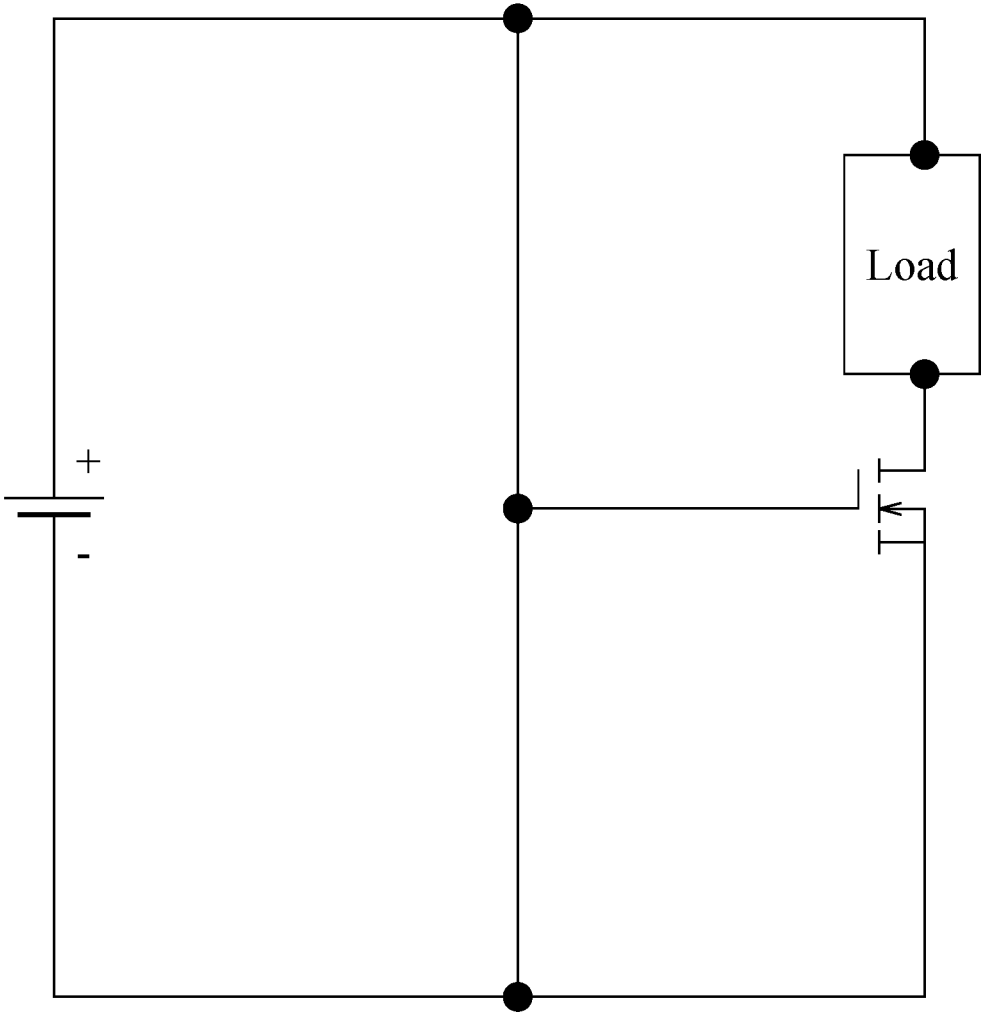
FIG. 10 is a circuit block diagram illustrating a device of comparative example 1 (CE1) according to the disclosure.
Figure 11:
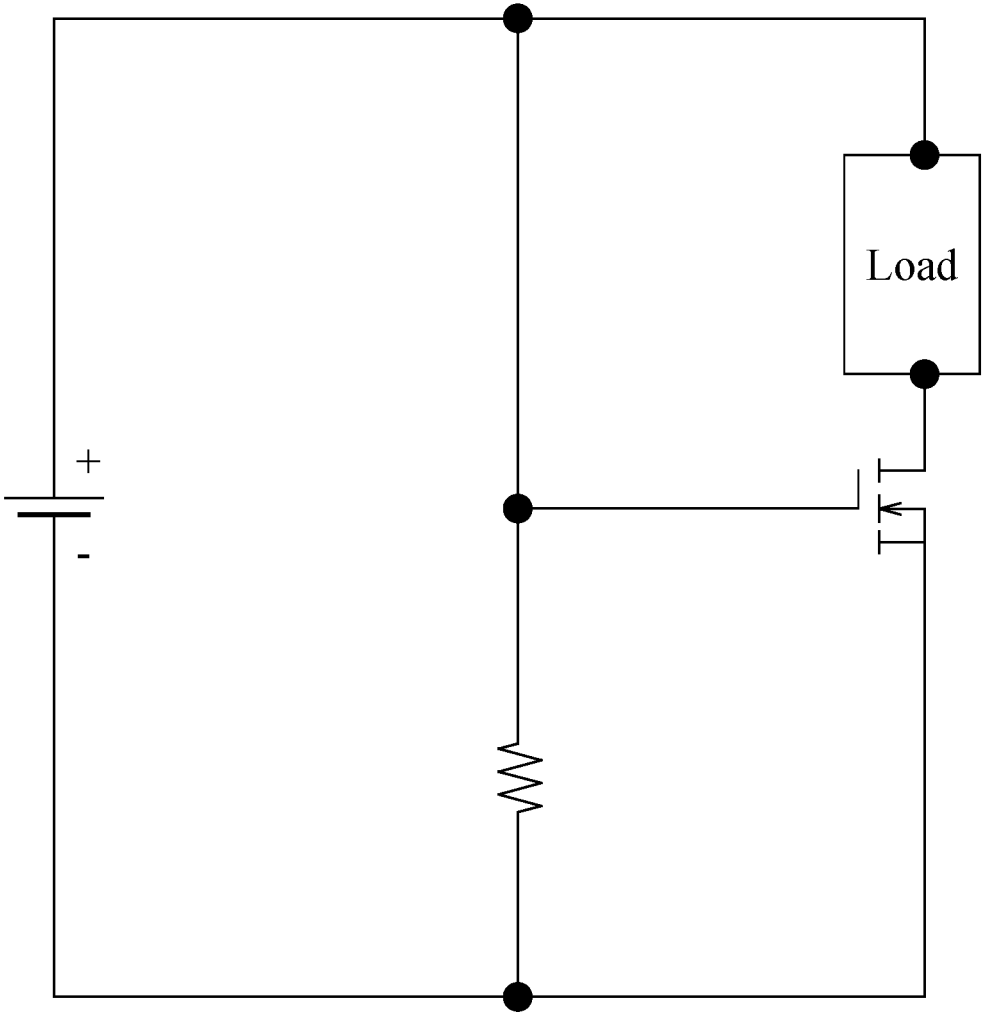
FIG. 11 is a circuit block diagram illustrating a device of comparative example 2 (CE2) according to the disclosure.
Figure 12:
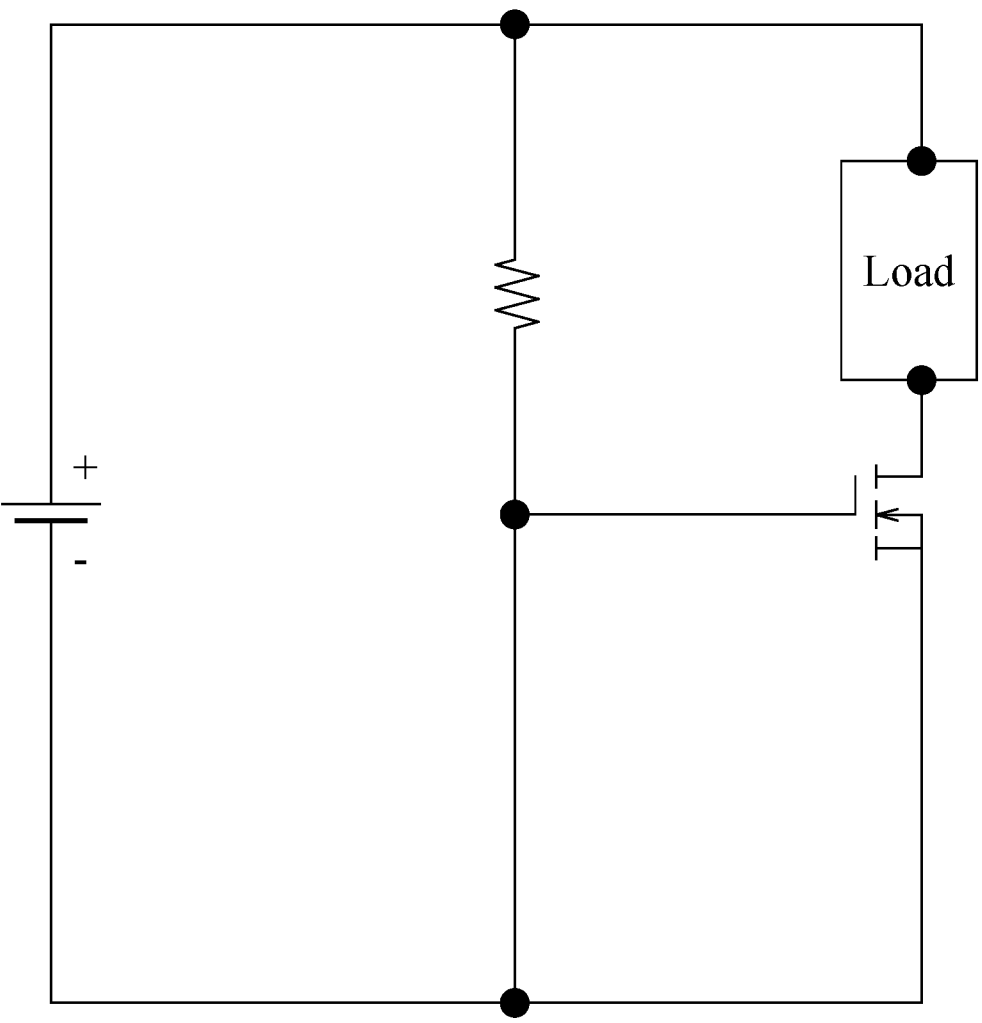
FIG. 12 is a circuit block diagram illustrating a device of comparative example 3 (CE3) according to the disclosure.
Figure 13:
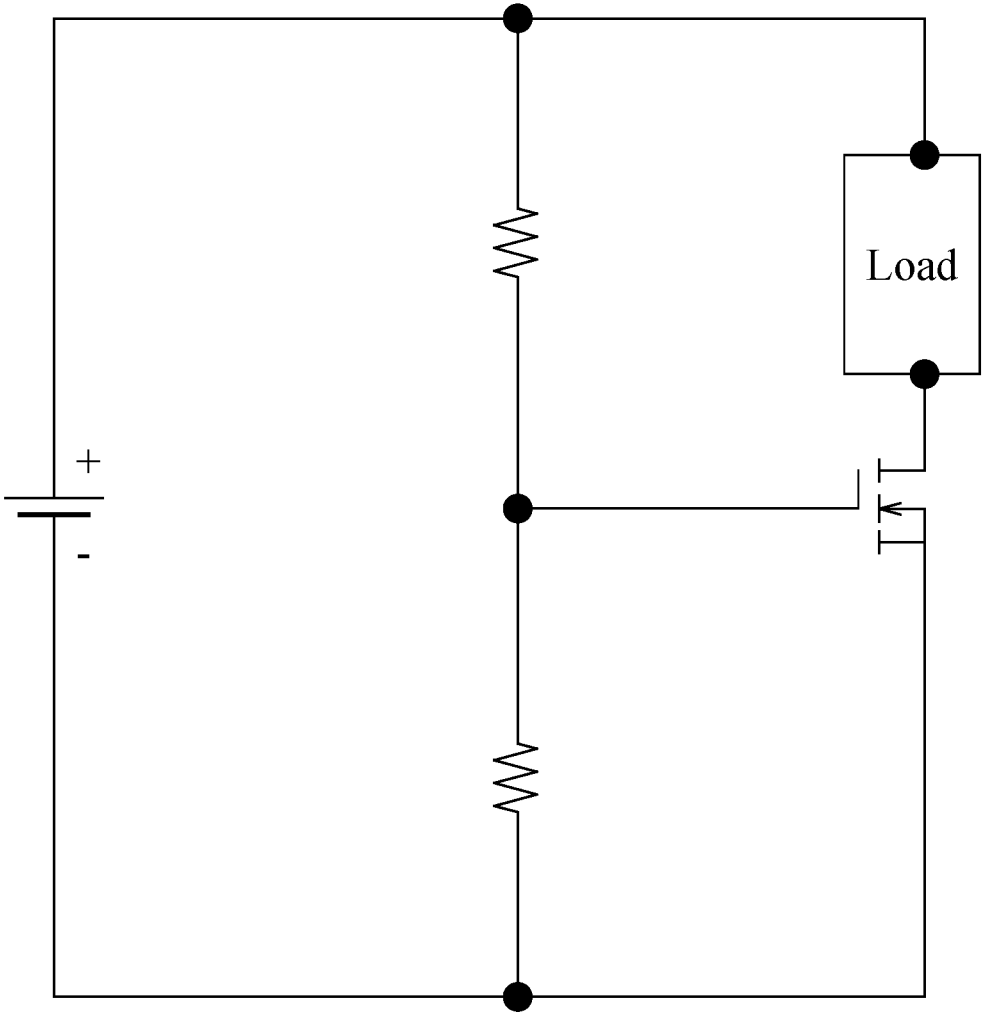
FIG. 13 is a circuit block diagram illustrating a device of comparative example 4 (CE4) according to the disclosure.

FIGS. 10 to 13 are circuit block diagrams respectively illustrating devices of CE1 to CE4. The devices of CE1 (as depicted in FIG. 10) and CE2 (as depicted in FIG. 11) were respectively similar to those of E1 (as depicted in FIG. 3) and E3 (as depicted in FIG. 8), except that the PTC component chip was not included in CE1 and CE2. The device of CE3 (as depicted in FIG. 12) was similar to that of E4 (as depicted in FIG. 8), except that the N-type resistor in E4 was not included in CE3, and the PTC component chip in E4 was replaced by an N-type resistor in CE3. The device of CE4 (as depicted in FIG. 13) was similar to that of E4 (as depicted in FIG. 8), except that the PTC component chip in E4 was replaced by an N-type resistor in CE4.

For simplicity, the structures of the composite circuit protection devices of E1 to E6 and the devices of CE1 to CE4 are summarized in Table 3, where "V" is an indicator for existence.

TABLE 3

| | Composite circuit protection device | | | |
|---|---|---|---|---|
| | PTC component chip | Hole | MOSFET chip | Resistor |
| E1 | V | | V | |
| E2 | V | V | V | |
| E3 | V | | V | V |
| E4 | V | V | V | V |
| E5 | V | | V | V |
| E6 | V | | V | V |
| CE1 | | | V | |
| CE2 | | | V | V |
| CE3 | | | V | V |
| CE4 | | | V | V |

Performance Test

Surge Immunity Test

The devices of each of E1 to E6 and CE1 to CE4, serving as test devices, were subjected to a surge immunity test where a load has a resistance of 6Ω. A number of the test devices of each of E1 to E6 and CE1 to CE4 was ten. For E1 to E6 and CE1 to CE4, the surge immunity test for each test device was conducted in the presence of a test voltage of 30 V and a test current of 1 A and 10 A, by switching on for 60 seconds and then off. If both of the PTC component chip and the MOSFET chip were not burned out and damaged, the test device was determined to pass the surge immunity test, and an average of the time at which the PTC component chip of the test device tripped (i.e., trip time), if any, was recorded. If one of the PTC component chip and the MOSFET chip was burned out, the test device was determined to fail the surge immunity test, and an average of the time at which the PTC component chip or the MOSFET chip was burned out (i.e., burned-out time) was recorded. The results are shown in Table 4.

TABLE 4

| | Surge Immunity Test | | | |
| --- | --- | --- | --- | --- |
| | Test voltage: 30 V; Test current: 1 A | | Test voltage: 30 V; Test current: 10 A | |
| Test device | Trip time/ burned-out time (s) | Test result | Trip time/ burned-out time (s) | Test result |
| E1 | 0.130 | Pass | 0.050 | Pass |
| E2 | 0.125 | Pass | 0.045 | Pass |
| E3 | 0.125 | Pass | 0.050 | Pass |
| E4 | 0.120 | Pass | 0.045 | Pass |
| E5 | 0.145 | Pass | 0.050 | Pass |
| E6 | 0.150 | Pass | 0.055 | Pass |
| CE1 | 0.165 | Fail | 0.065 | Fail |
| CE2 | 0.160 | Fail | 0.060 | Fail |
| CE3 | 0.165 | Fail | 0.065 | Fail |
| CE4 | 0.160 | Fail | 0.060 | Fail |

As shown in Table 4, the test devices of CE1 and CE3 were burned out within 0.165 seconds under the test current of 1 A and the test voltage of 30 V, and were burned out within 0.065 seconds under the test current of 10 A and the test voltage of 30 V; and the test devices of CE2 and CE4 were burned out within 0.160 seconds under the test current of 1 A and the test voltage of 30 V, and were burned out within 0.060 seconds under the test current of 10 A and the test voltage of 30 V. The reason for the test devices of CE1 to CE4 being burned out may reside in that: the MOSFET chip can only withstand a voltage greater than 20 V (the maximum gate-source voltage (Ves) of the MOSFET chip) for a short period of time. Because of material properties of the MOSFET chip, such damage in the test devices of CE1 to CE4 cannot be repaired. In contrast, all of the test devices of E1 to E6 that included a combination of the PTC component chip and the MOSFET chip (the PTC component chip attaching to the MOSFET chip) passed the surge immunity test without being burned out. It is found that the PTC component chip can trip fast before the MOSFET chip burns out in the presence of an over-voltage (e.g., a voltage greater than the maximum gate-source voltage ($V_{GS}$) of the MOSFET chip) and an over-current, and has a high-voltage endurability, thereby preventing the MOSFET chip from being burned out. In addition, as respectively compared to E1 and E3, formation of the holes in the PTC component chips in E2 and E4 induce an improved heat transferring effect, which may further shorten the time period of the PTC component chips to be tripped, and thus prevent the over-current from flowing through the MOSFET chips, thereby preventing the MOSFET chips from being burned out.

Although the test voltage is greater than the maximum gate-source voltage ($V_{GS}$) of the MOSFET chip, the rated voltage of the PTC component chip is greater than the test voltage and a temperature of the MOSFET chip may increase during the surge immunity test, which may induce a mutual protection effect, and an unexpected result for the high-voltage surge endurability of the composite circuit protection devices of E1 to E6.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A composite circuit protection device, comprising:
a transistor that includes a drain electrode, a gate electrode, and a source electrode;
a positive temperature coefficient (PTC) component that includes a first electrode, a second electrode and a PTC matrix disposed between said first electrode and said second electrode, said second electrode being in contact with said gate electrode of said transistor;
a first lead pin that is bonded to said drain electrode of said transistor;
a second lead pin that is bonded to one of said first electrode and said second electrode of said PTC component; and
a third lead pin that is bonded to said source electrode of said transistor;
wherein said PTC component has a rated voltage that ranges between 250% and 350% of a maximum gate-source voltage of said transistor.

2. The composite circuit protection device as claimed in claim 1, wherein said PTC component is formed with a hole that is formed in said PTC matrix.

3. The composite circuit protection device as claimed in claim 1, wherein said second lead pin is bonded to said second electrode of said PTC component, and said first electrode of said PTC component is electrically connected to said source electrode of said transistor.

4. The composite circuit protection device as claimed in claim 1, wherein said second lead pin is bonded to said first electrode of said PTC component, and said composite circuit protection device further comprises a resistive element electrically connected between said gate electrode and said source electrode of said transistor.

5. The composite circuit protection device as claimed in claim 4, operatively associated with a load, wherein a ratio of a resistance of the load to a sum of a resistance of said PTC component, a resistance of said resistive element and the resistance of the load falls within a range of from 0.99% to 50%.

6. The composite circuit protection device as claimed in claim 1, wherein said rated voltage of said PTC component is 300% of the maximum gate-source voltage of said transistor.

7. The composite circuit protection device as claimed in claim 1, wherein said PTC matrix of said PTC component includes a non-grafted olefin-based polymer and a conductive filler.

8. The composite circuit protection device as claimed in claim 7, wherein said non-grafted olefin-based polymer is a high density polyethylene.

9. The composite circuit protection device as claimed in claim 7, wherein said conductive filler includes one of carbon black, metal powder, conductive ceramic powder, and combinations thereof.

10. The composite circuit protection device as claimed in claim 7, wherein said PTC matrix of said PTC component further includes an unsaturated carboxylic acid grafted olefin-based polymer.

11. The composite circuit protection device as claimed in claim 1, wherein said transistor is a metal oxide semiconductor field effect transistor.

12. The composite circuit protection device as claimed in claim 11, wherein a conductivity type of said metal oxide semiconductor field effect transistor is N-type.

13. The composite circuit protection device as claimed in claim 1, further comprising an encapsulant that encloses said PTC component, said transistor, and a portion of each of said first lead pin, said second lead pin and said third lead pin.

14. The composite circuit protection device as claimed in claim 13, wherein said encapsulant is made of epoxy resin.

15. The composite circuit protection device as claimed in claim 1, wherein:

said second lead pin is configured to be electrically connected to a positive terminal of a power source and a first terminal of a load;

said first lead pin is configured to be electrically connected to a second terminal of the load; and said third lead pin is configured to be electrically connected to a negative terminal of the power source.

* * * * *